United States Patent
Chou et al.

(10) Patent No.: US 10,838,295 B2
(45) Date of Patent: Nov. 17, 2020

(54) PHOTOMASK AND FABRICATION METHOD THEREFOR

(71) Applicant: TAIWAN SEMICONDUCTOR MANUFACTURING COMPANY, LTD., Hsinchu (TW)

(72) Inventors: You-Hua Chou, Hsinchu (TW); Kuo-Sheng Chuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 107 days.

(21) Appl. No.: 15/586,599

(22) Filed: May 4, 2017

(65) Prior Publication Data
US 2018/0321581 A1    Nov. 8, 2018

(51) Int. Cl.
| G03F 1/58 | (2012.01) |
| G03F 1/68 | (2012.01) |
| G06F 30/398 | (2020.01) |
| G03F 1/26 | (2012.01) |
| G03F 1/70 | (2012.01) |
| G03F 1/76 | (2012.01) |
| H01L 21/033 | (2006.01) |

(52) U.S. Cl.
CPC ............ *G03F 1/58* (2013.01); *G03F 1/26* (2013.01); *G03F 1/68* (2013.01); *G03F 1/70* (2013.01); *G03F 1/76* (2013.01); *G06F 30/398* (2020.01); *H01L 21/0332* (2013.01); *H01L 21/0337* (2013.01); *H01L 21/0338* (2013.01)

(58) Field of Classification Search
CPC ..... G03F 1/26; G03F 1/70; G03F 1/58; G03F 1/68; G03F 1/76; H01L 21/0332; H01L 21/0335; H01L 21/0337; H01L 21/0338; H01L 21/0273; G06F 17/5081
See application file for complete search history.

(56) References Cited

U.S. PATENT DOCUMENTS

| 6,311,319 | B1 * | 10/2001 | Tu ............... | G03F 7/70433 430/22 |
| 6,869,738 | B2 * | 3/2005 | Oshima .......... | G03F 1/36 430/30 |
| 8,124,300 | B1 * | 2/2012 | Singh ............ | G03F 1/72 430/30 |
| 2001/0034124 | A1 * | 10/2001 | Templeton ...... | H01L 29/40114 438/669 |
| 2006/0240334 | A1 * | 10/2006 | Huh .............. | B82Y 10/00 430/5 |
| 2009/0061330 | A1 * | 3/2009 | Irie .............. | G03F 1/29 430/5 |
| 2009/0142673 | A1 * | 6/2009 | Gao ............. | G03F 1/50 430/5 |

(Continued)

FOREIGN PATENT DOCUMENTS

| JP | 55-161240 | * 12/1980 | ............. G03F 1/00 |
| JP | 56-072445 | * 6/1981 | ............. G06F 1/00 |

(Continued)

*Primary Examiner* — Martin J Angebranndt
(74) *Attorney, Agent, or Firm* — Hauptman Ham, LLP

(57) ABSTRACT

A method of manufacturing a photomask includes depositing a first absorbing layer over a substrate, patterning the first absorbing layer using a photoresist, and depositing a conformal second absorbing layer along surfaces of the first absorbing layer.

18 Claims, 7 Drawing Sheets

(56) References Cited

U.S. PATENT DOCUMENTS

| | | | |
|---|---|---|---|
| 2011/0136048 A1* | 6/2011 | Shimizu | G03F 1/26 430/5 |
| 2012/0261563 A1* | 10/2012 | Lai | H01L 22/12 250/252.1 |
| 2013/0280644 A1* | 10/2013 | Lin | G03F 1/22 430/5 |
| 2014/0227635 A1* | 8/2014 | Kim | G03F 1/24 430/5 |
| 2015/0379188 A1* | 12/2015 | Kahng | G06F 17/5081 716/53 |
| 2016/0238924 A1* | 8/2016 | Burkhardt | G03F 1/24 |

FOREIGN PATENT DOCUMENTS

| | | | | |
|---|---|---|---|---|
| JP | 59-187343 | * | 10/1984 | G03F 1/00 |
| JP | 10-056247 | * | 2/1988 | H05K 1/09 |
| JP | 01-166046 | * | 6/1989 | G03F 1/00 |
| JP | 04-051238 | * | 2/1992 | G03F 1/08 |
| JP | 09-050112 | * | 2/1997 | G03F 1/08 |
| JP | 11-084627 | * | 1/1999 | G03F 1/08 |
| JP | 2000-340110 | * | 12/2000 | H01J 9/14 |
| JP | 2002-228619 | * | 8/2002 | G03F 7/004 |
| JP | 2008-026668 | * | 2/2008 | G03F 1/08 |
| JP | 2009009618 | * | 1/2009 | H01J 21/027 |
| JP | 2009-282290 | * | 12/2009 | |
| JP | 2010-014931 | * | 1/2010 | G03F 1/08 |
| JP | 2013-065739 | * | 4/2013 | G03F 1/22 |

* cited by examiner

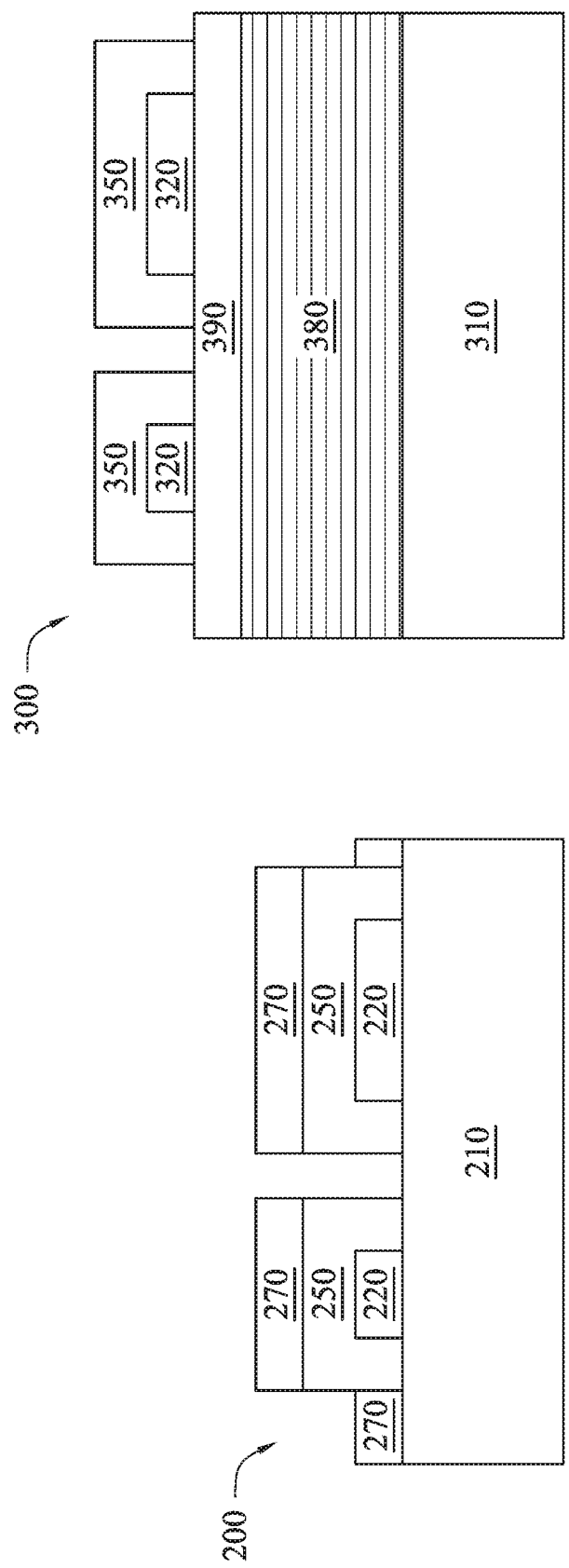

PHOTOMASK AND FABRICATION METHOD THEREFOR

BACKGROUND

Photolithography is utilized in the fabrication of semiconductor devices to transfer a pattern onto a wafer. Based on various integrated circuit (IC) layouts, patterns of a mask are reduced, e.g., by a factor of 2:1, 4:1 or 5:1, in order to transfer a smaller pattern to a surface of the wafer. The mask, also called a reticle, is made of a transparent substrate with one or more opaque materials deposited on one side to block incident radiation. As density in IC chips increases, resolution enhancement techniques, such as phase-shift mask (PSM), optical proximity correction (OPC), off-axis illumination (OAI) and double dipole lithography (DDL), are developed to improve depth of focus (DOF) and/or to achieve a more precise pattern transfer onto the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2E are cross-sectional views of a photomask at various stages of manufacturing in accordance with one or more embodiments.

FIG. 3 is a cross-sectional view of a photomask in accordance with one or more embodiments.

DETAILED DESCRIPTION

Figures 1A, 1B:
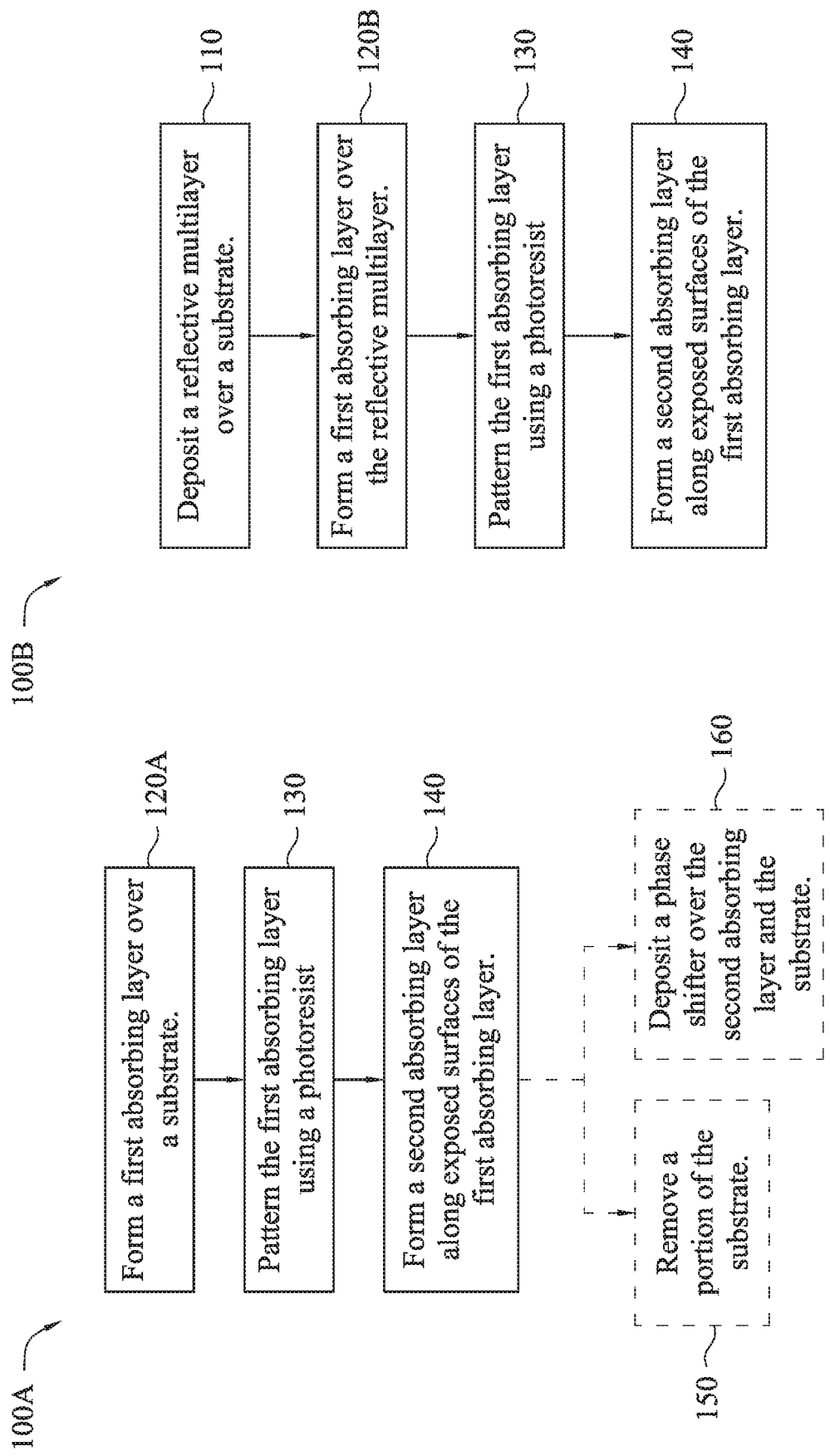
FIG. 1A is a flowchart of a method of fabricating a photomask in accordance with one or more embodiments.
FIG. 1B is a flowchart of a method of fabricating a photomask in accordance with one or more embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures.

Semiconductor device feature sizes have become smaller than a wavelength of light used in photolithography processes. As a result, the ability to manufacture the pattern features, such as critical dimension (CD) uniformity and image fidelity, have become more sensitive to a minimum dimension and line width roughness (LWR) of a photomask (also called a reticle). In some embodiments, the minimum dimension of the photomask is decreased by a multiple-deposition technique of an absorbing layer on a transparent substrate. In some instances, an initially formed absorbing layer is followed by depositing a subsequent absorbing layer. Such subsequent deposition includes an isotropic accretion technique such as electroless plating or atomic layer deposition (ALD). As a result, a stability of critical parts of a photomask is increased in comparison with other techniques, thereby improving a production yield of photomask in comparison with another approach. In addition, because the initially formed absorbing layer has a relatively smaller thickness, a processing time during an etching of the absorbing layer is shorter, resulting in a smaller LWR and improved tilting angle at an opening of the absorbing layer. The smaller LWR and improved tilting angle are able to be maintained during the subsequent deposition; therefore, in comparison with the absorbing layer fabricated by other approaches, the photomask using multiple depositions has a better CD uniformity and image fidelity.

FIG. 1A is a flowchart of a method 100A of fabricating a photomask in accordance with one or more embodiments. One of ordinary skill in the art would understand that additional operations are able to be performed before, during, and/or after method 100A depicted in FIG. 1A, in some instances. Method 100A includes operation 120A in which a first absorbing layer is formed over a substrate. In some embodiments, a thickness of the absorbing layer ranges from about 100 angstrom (Å) to about 500 Å. A smaller thickness increases a difficulty of deposition process, in some instances. A greater thickness decreases a process window in a subsequent deposition process, in some instances. The process window is established by boundary values, i.e., a range of acceptable or stable values of a parameter for a semiconductor manufacturing process. In at least one embodiment, the first absorbing layer is deposited using electroless plating, which is also referred to as chemical plating or autocatalytic plating. The electroless plating is performed by using a plating solution containing metal ions, such as chromium ions, nickel ions, cobalt ions or ruthenium ions. The plating solution further includes a catalyst such as palladium, a pH buffer, a pH adjusting agent, a wetting agent and a reducing agent such as sodium hypophosphite. The reducing agent reacts with metal ions, thereby depositing the first absorbing layer over the substrate. In comparison with other approaches, the first absorbing layer formed by electroless plating is more conformal and uniform, and provides a good adhesion for a subsequent layer formed over the first absorbing layer. In some embodiments where the metal ions are chromium ions, the metal ions contained in the plating solution are supplied from a chromium salt, for example, chrome alum or chromium sulfate. Depending on a predetermined thickness of the absorbing layer, a temperature of the plating solution ranges from about 15 degrees Celsius to about 250 degrees Celsius, a process duration ranges from about 5 seconds to about 300 seconds, and a pressure ranges from about 0.5 torr to about 760 torr. A higher temperature increases a plating rate, thereby reducing process duration. In some embodiments, a surface of the substrate is sensitized or activated before performing electroless plating. In some embodiments, the sensitization treatment includes exposing the substrate in an acidic solution containing stannous ions for a duration ranging from about 5 minutes to about 10 minutes.

In various embodiments, the first absorbing layer is deposited using ALD. In some embodiments, a pre-clean of an exposed surface of the substrate is performed to remove particles or contaminants. The first absorbing layer is formed by a sequence of processing cycles. First, the exposed surface of the substrate is treated by a metal-containing precursor, such as a chromium included precursor (e.g., chromium hexacarbonyl, chromium carbonyl, chromium (III) acetylacetonate, bis(cyclopentadienyl)chromium(II), bis(pentamethylcyclopentadienyl)chromium(II) or chromium(III) tris(2,2,6,6-tetramethyl-3,5-heptanedionate)). The precursor is then purged by an inert gas, such as nitrogen, argon or helium, or another suitable gas. Next, a reactant agent is injected to react with the precursor. Fourth, the substrate is purged by inert gas to remove redundant reactant agent. By repeating the processing cycles multiple times, a desired thickness of the first absorbing layer is formed. In some embodiments where the metal-containing precursor includes chromium, the first absorbing layer includes one or multiple materials including chromium, chromium oxide and/or chromium nitride. In comparison with other approaches, the first absorbing layer formed by ALD is more conformal and uniform, and provides a good adhesion for a subsequent layer formed over the first absorbing layer.

In various embodiments, the first absorbing layer is formed by another suitable process, such as plasma enhanced ALD (PEALD), electroplating, magnetron sputtering, RF sputtering or e-beam/ion-beam evaporation.

Method 100A continues with operation 130 in which the first absorbing layer is patterned using a photoresist. The photoresist is coated over the first absorbing layer by a spin-on process followed by a baking process. The photoresist is a positive tone resist or a negative tone resist. Depending on various chemical structures, the photoresist has a thickness ranging from about 500 nanometers (nm) to about 1000 nm. The photoresist is selectively bombarded by an electron beam (e-beam) writing technique or an optical laser writing technique, and a polymer in the photoresist is broken under the exposure. In some embodiments, the photoresist is developed in a developing solution and the exposed portion of the photoresist is dissolved. In some embodiments, the developing solution removes the unexposed portion of the photoresist. The remaining photoresist defines a first pattern set.

Next, a portion of the absorbing layer is removed through the remaining photoresist to form the first pattern set. The removal of the absorbing layer includes an etch process, such as a wet etching, a dry etching or a combination thereof. In some embodiments, the wet etching solution includes a mixture of chloric acid and cerium (IV) ammonium nitrate. In some embodiments, the dry etching uses a fluorine-containing gas, (e.g. tetrafluormethane, sulfur hexafluoride, difluoromethane and/or hexafluoroethane), a chlorine-containing gas (e.g., chlorine gas, chloroform and/or carbon tetrachloride), a bromine-containing gas, an oxygen-containing gas or another suitable gas. In some embodiments, the dry etching uses a plasma-enhanced technique. In some embodiments, the etch process includes multiple etching steps to gain etch selectivity and desired etch profile. The remaining photoresist is stripped after the etch process and is followed by a clean process, in some instances.

Alternatively, the first pattern set is formed by increasing a power of the e-beam sufficient to burn out the photoresist so that the exposed portion of the photoresist is removed. In some embodiments, a current/voltage of the e-beam ranges from about 150 kilo electron volts (KeV) to about 650 KeV.

In some embodiments, a thickness of the first absorbing layer is determined based on a thickness of the second absorbing layer. After the removal process, the thickness of the first absorbing layer ranges from about a tenth to about a half of the thickness in a subsequent deposition process. The thickness helps to produce a line width roughness (LWR) of the first absorbing layer equal to or smaller than 2 nm. Also, an etch time of the first absorbing layer is shorter due to a thinner thickness. The reduced etch time results in an angle between a top surface of the first absorbing layer and a sidewall of the first absorbing layer in a range from about 90 degrees to about 93 degrees. In at least one embodiment, the angle is substantially 90 degrees. Such small LWR and substantially right angle help to decrease variations in CD and enhance device performance, such as reducing leakage current.

Method 100A continues with operation 140 in which a second absorbing layer is formed along exposed surfaces of the first absorbing layer. A thickness ratio of the second absorbing layer to the first absorbing layer ranges from about 2:1 to about 10:1. Because a total thickness of the first absorbing layer and the second absorbing layer is predetermined, a greater ratio denotes a thinner first absorbing layer, thereby increasing a difficulty of fabricating the first absorbing layer, in some instances. A smaller ratio increases the LWR of the first absorbing layer and/or the angle between a top surface of the second absorbing layer and a sidewall of the second absorbing layer, in some instances. In some embodiments, the second absorbing layer is deposited using electroless plating or ALD similar to the first absorbing layer. When each pattern of the first pattern set is arranged in a rectilinear fashion, the pattern extends along a first dimension parallel to the surface of the substrate and along a second dimension perpendicular to the first dimension. As a result, the second absorbing layer has a uniform thickness along the first dimension, the second dimension and a third dimension being orthogonal to the first dimension and the second dimension.

In some embodiments, the second absorbing layer is formed using a same process as the first absorbing layer. In some embodiments, the second absorbing layer is formed using a different process from the first absorbing layer. The second absorbing layer includes, but is not limited to, chromium, nickel, cobalt or ruthenium. In some embodiments, the second absorbing layer includes a same material as the first absorbing layer. In some embodiments, the second absorbing layer includes a different material from the first absorbing layer. For one example where the second absorbing layer includes cobalt and is formed by ALD, a metal-containing precursor may comprise octacarbonyl dicobalt, biscyclopentadienyl cobalt, dicobalt hexacarbonyl butylacetylene, cyclopentadienyl cobalt dicarbonyl, with the chemical formula (C5H5(CO)2Co), and/or the like. In at least one embodiment, a binary mask is fabricated after the deposition of the second absorbing layer. An opaque area occupied by a combination of the first absorbing layer and the second absorbing layer, also referred to as a dark tone in some instances, defines a second pattern set.

Because the second absorbing layer is uniformly and evenly formed over all geometries of the first absorbing layer, a LWR of the second absorbing layer is equal to or smaller than 2 nm, and an angle between a top surface of the second absorbing layer and a sidewall of the second absorbing layer ranges from about 90 degrees to about 93 degrees. In some embodiments, the second absorbing layer has a conformity equal to or greater than 98% and a sidewall step coverage equal to or greater than 98%. The sidewall step coverage is defined as a ratio of a minimum value to a maximum value of sidewall thickness. One of ordinary skill in the art would understand that in some instances a third absorbing layer is selectively formed along exposed surfaces of the second absorbing layer and a combination of the first, second and third absorbing layers defines a third pattern set.

Method 100A continues with optional operation 150 in which a portion of the substrate is removed. In some embodiments where the photomask is an alternating phase shifting mask, a recess formed in the substrate causes a π (i.e., 180+/−3 degrees) shift of the incident radiation. The removal of the portion of the substrate includes an etch process, such as a wet etching, a dry etching or a combination thereof.

Method 100A continues with optional operation 160 in which a phase shifter is deposited over the second absorbing layer and the substrate. In some embodiments where the photomask is an attenuated phase shifting mask, a phase shifter which allows a small percentage, e.g., from about 6% to about 9%, of the incident radiation to pass through the substrate and causes a π shift is deposited. The deposition of the phase shifter includes ALD, chemical vapor deposition (CVD), physical vapor deposition (PVD), pulsed laser deposition (PLD), sputter, spin-on-dielectric (SOD), or the like, or a combination thereof. Based on a wavelength of a light source, a thickness of the phase shifter ranges from about 100 nm to about 1000 nm. In some embodiments, the phase shifter has a thickness of about $\lambda/[2(n-1)]$, wherein $\lambda$ is the wavelength of a radiation beam projected on the photomask during a photolithography process(es) for wafer fabrication, and n is a refractive index of the phase shifter relative to the radiation beam. A greater or smaller thickness increases a deviation from a phase shift by π, reducing a pattern resolution, in some instances. However, one of ordinary skill in the art would understand that the thickness of the phase shifter is determined by a transmission rate of the selected material, wavelength of the light source, and a depth of focus (DOF) during the process. For example, where the phase shifter includes molybdenum, the thickness of the phase shifter is a multiple integer n of the light wavelength $\lambda$ so that a π phase shift is occurred. In some embodiments, the phase shifter thickness ranges from about 60 nm to about 80 nm.

FIG. 1B is a flowchart of a method 100B of fabricating a photomask in accordance with one or more embodiments. Method 100B includes elements similar to method 100A and reference numbers of like elements are the same. In comparison with method 100A, which introduces a transmission photomask, method 100B introduces a reflective photomask, which is used for extreme ultraviolet (EUV) wavelengths. Method 100B includes operation 110 in which a reflective multilayer is deposited over a substrate. In some embodiments, the reflective multilayer includes multiple alternating layers of materials having a high refractive index and a low refractive index. The material having a high refractive index has a tendency to scatter EUV light and the material having a low refractive index has a tendency to transmit EUV light. Pairing these two type of materials together provides a resonant reflectivity. In some embodiments, the deposition of each film of the reflective multilayer includes ALD, PVD, CVD, such as atmospheric pressure CVD (APCVD), low pressure CVD (LPCVD), plasma-enhanced CVD (PECVD), or high density plasma CVD (HDPCVD), or another suitable process.

A capping layer is optionally formed over the reflective multilayer in order to help prevent oxidation of the reflective multilayer. In some embodiments, the capping layer is deposited by a same method as the reflective multilayer. In some embodiments, the capping layer is deposited by a different method from the reflective multilayer.

Method 100B continues with operation 120B in which a first absorbing layer is formed over the reflective layer. Operation 120B is similar to operation 120A, the first absorbing layer, having a thickness ranging from about 100 Å to about 500 Å, is deposited. In some embodiments, the first absorbing layer is deposited using electroless plating or ALD. Next, method 100B continues with operation 130 and operation 140 to fabricate the reflective photomask.

Figure 2B:
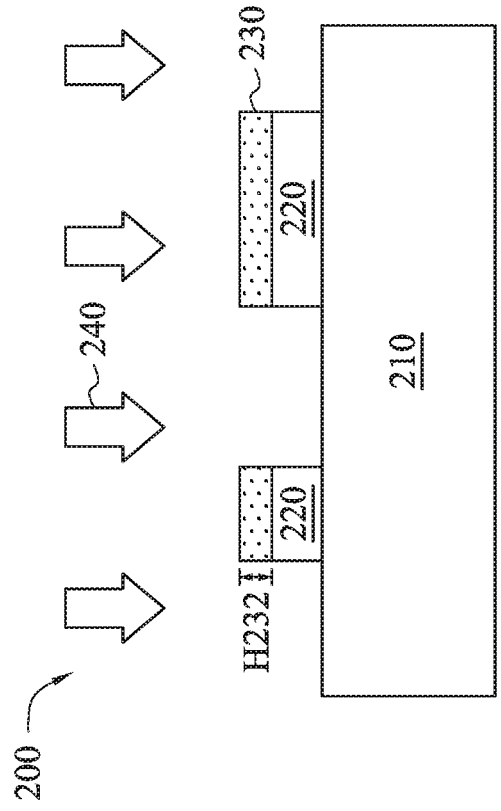
Figure 2D:
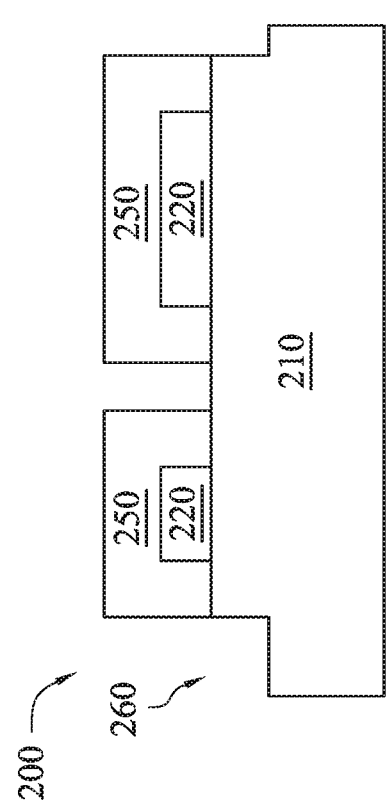
Figure 2A:
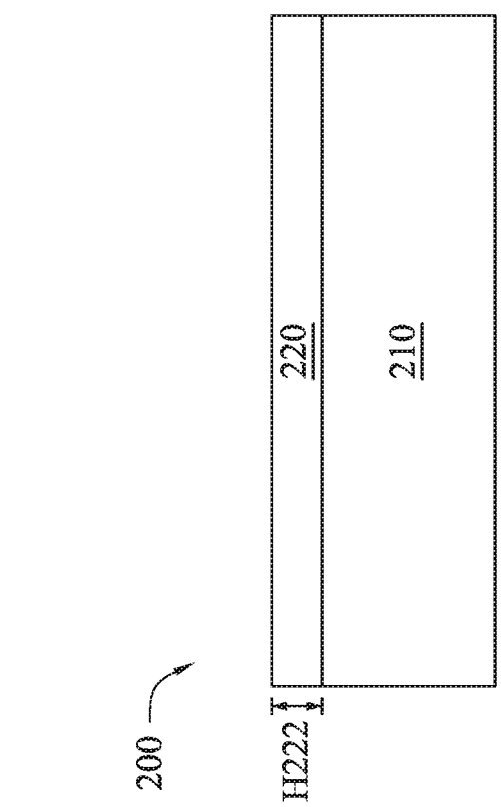

FIGS. 2A-2E are cross-sectional views of a photomask 200 at various stages of manufacturing in accordance with one or more embodiments. FIG. 2A is a cross-sectional view of photomask 200 following operation 120A of method 100A. Photomask 200 includes a substrate 210 and a first absorbing layer 220. Substrate 210 includes glass, quartz, fused silica, calcium fluoride, silicon oxide-titanium oxide alloy, sapphire or another suitable material. In some embodiments, substrate 210 has a thickness ranging from about 0.22 centimeters (cm) to about 0.75 cm. A greater thickness increases a manufacturing cost without a significant improvement in functionality, in some instances. A smaller thickness increases a risk of cracking/breaking of photomask 200 during a photolithography process, in some instances. In some embodiments, first absorbing layer 220 includes chromium, nickel, cobalt or ruthenium, having a thickness H222 ranging from about 100 Å to 500 Å.

FIG. 2B is a cross-sectional view of photomask 200 following operation 130. A photoresist 230 is coated over first absorbing layer 220 and has a thickness H232 ranging from about 500 nm to about 1000 nm. Next, photoresist 230 is exposed using an e-beam writing technique 240 and a portion of first absorbing layer 220 is removed from substrate 210. A first pattern set is therefore formed according to a predetermined image to be transferred onto a semiconductor wafer or other integrated circuit (IC) substrate.

Figure 2C:
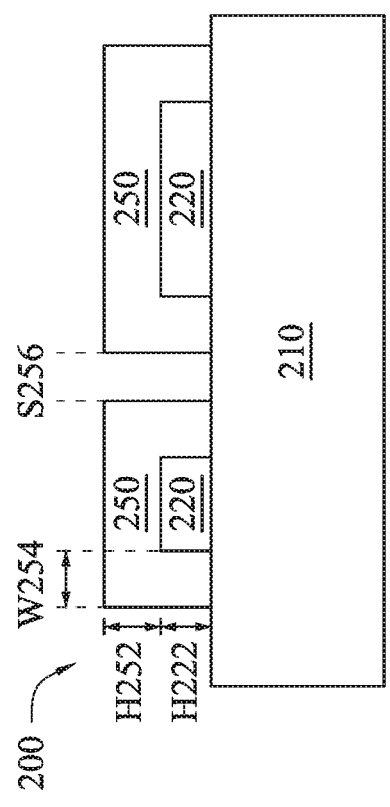

FIG. 2C is a cross-sectional view of photomask 200 following operation 140. A second absorbing layer 250 extends from surfaces of first absorbing layer 220. Second absorbing layer 250 has a thickness H252 ranging from about 500 Å to about 1000 Å, which is about 1 to about 10 times the thickness H222. Because second absorbing layer 250 is conformally deposited over first absorbing layer 220, thickness H252 is substantially equal to a width W254, which is parallel with a surface of substrate 210. In some embodiments, a percentage between thickness H252 and width W254 ranges from about 90% to about 110%.

In some embodiments, second absorbing layer 250 includes chromium, nickel, cobalt or ruthenium. In some embodiments, second absorbing layer 250 includes a same material as first absorbing layer 220. In some embodiments, second absorbing layer 250 includes a different material from the first absorbing layer 220. In some embodiments where photomask 200 is a binary mask, a combination of first absorbing layer 220 and second absorbing layer 250 defines a second pattern set, each pattern of the second pattern set blocks radiation from penetrating substrate 210 during the photolithography process to selectively expose a photomask layer on a wafer.

In various embodiments, at least one spacing S256 between adjacent patterns of the second pattern set ranges from about 1 nm to about 5 nm. That is, by forming second absorbing layer 250, a minimum width of a pattern or a minimum spacing between two patterns (e.g., CD or design rule limitation) is shorter than a photomask fabricated by another approach.

FIG. 2D is a cross-sectional view of photomask 200 following optional operation 150. A second photoresist is formed and patterned over second absorbing layer 250 and substrate 210, followed by an etch process to remove a portion of substrate 210. As a result, a recess 260 is formed in substrate 210. A depth of recess 260 is predetermined based on a refraction index of substrate 210 and wavelengths of incident radiation to realize a phase shift. In some embodiments, the depth of recess 260 ranges from about 1 nm to about 4 nm. In some embodiments, the depth of recess 260 ranges from about 500 to about 700 nm. A greater or smaller depth negatively affects a resolution of photomask 200, in some instances. In some embodiments, based on an arrangement of etched portion and unetched portion of substrate 210, photomask 200 is also referred to as a tri-tone PSM.

FIG. 2E is a cross-sectional view of photomask 200 following optional operation 160. A phase shifter 270 is partially over substrate 210 and completely over second absorbing layer 250. In some embodiments where photomask 200 is an attenuated phase shifting mask, a total transmission rate of incident radiation passing through phase shifter 270 ranges from about 6% to about 9%. In some embodiments where photomask 200 is a high-transmission phase shifting mask, a total transmission rate incident radiation passing through phase shifter 270 ranges from about 18% to about 20%. In some embodiments, phase shifter 270 includes a spin-on-glass (SPG) dielectric material. In some embodiments, phase shifter 270 includes silicon nitride, tantalum silicate, molybdenum silicide, molybdenum silicon oxynitride, tantalum nitride or another suitable material. In some embodiments, phase shifter 270 includes a single layer over substrate 210. In some embodiments, phase shifter 270 includes multiple layers, such as pairs of molybdenum silicide and silicon oxide films.

FIG. 3 is a cross-sectional view of photomask 300 following operation 140 of method 100B. Photomask 300 includes elements similar to mask 200 and a last two digits of like elements are the same. A reflective multilayer 380 is formed over a substrate 310. In at least one embodiment, reflective multilayer 380 includes a plurality of film pairs, such as molybdenum-silicon film pairs (e.g., a layer of molybdenum above or below a layer of silicon in each film pair). In another embodiment, reflective multilayer 380 includes molybdenum-beryllium film pairs, or any material which has a high reflectivity at EUV light is used for reflective multilayer 380. A thickness of each layer of reflective multilayer 380 depends on EUV wavelengths and an incident angle of light. In some embodiments, each layer of multilayer 380 has a thickness of approximately one quarter of the incident wavelength λ. The thickness of reflective multilayer 380 is adjusted to achieve a maximum constructive interference of EUV light reflected at each interface and a minimum absorption of EUV light by reflective multilayer 380. In some embodiments, reflective multilayer 380 is selected to provide a high reflectivity to a selected radiation type/wavelength, e.g., reflectivity of 70%. In some embodiments, a number of film pairs is from about 20 to about 80. In at least one embodiment, reflective multilayer 380 includes 40, or more, pairs of layers of molybdenum-silicon film. Each molybdenum-silicon film pair has a thickness ranging from about 6 nm to about 8 nm, with a total thickness of about 300 nm.

A capping layer 390 is over reflective multilayer 380. In some embodiments, capping layer 390 includes ruthenium, chromium, silicon dioxide, amorphous carbon or another suitable material. In some embodiments, a thickness of capping layer 390 ranges from about 20 nm to about 80 nm. A first absorbing layer 320 is over capping layer 390 and a second absorbing layer 350 is formed over surfaces of first absorbing layer 320. In comparison with another approach, photomask 300 is free of an anti-reflective coating (ARC) layer between capping layer 390 and first absorbing layer 320. In some embodiments, capping layer 390 has a different etch selectivity from first absorbing layer 320 so as to function as an etch stop layer. In some embodiments, a phase shifter is deposited over second absorbing layer 350 to form a destructive interference between radiations having a predetermined wavelength reflected from the absorbing region and the reflective region in photomask 300.

The formation of reflective multilayer 380 and capping layer 390 includes PVD such as evaporation, DC magnetron sputtering, CVD such as APCVD, LPCVD, PECVD, or HDPCVD, ion beam deposition, spin-on coating, metal-organic decomposition (MOD), and/or other suitable process.

Figure 4:
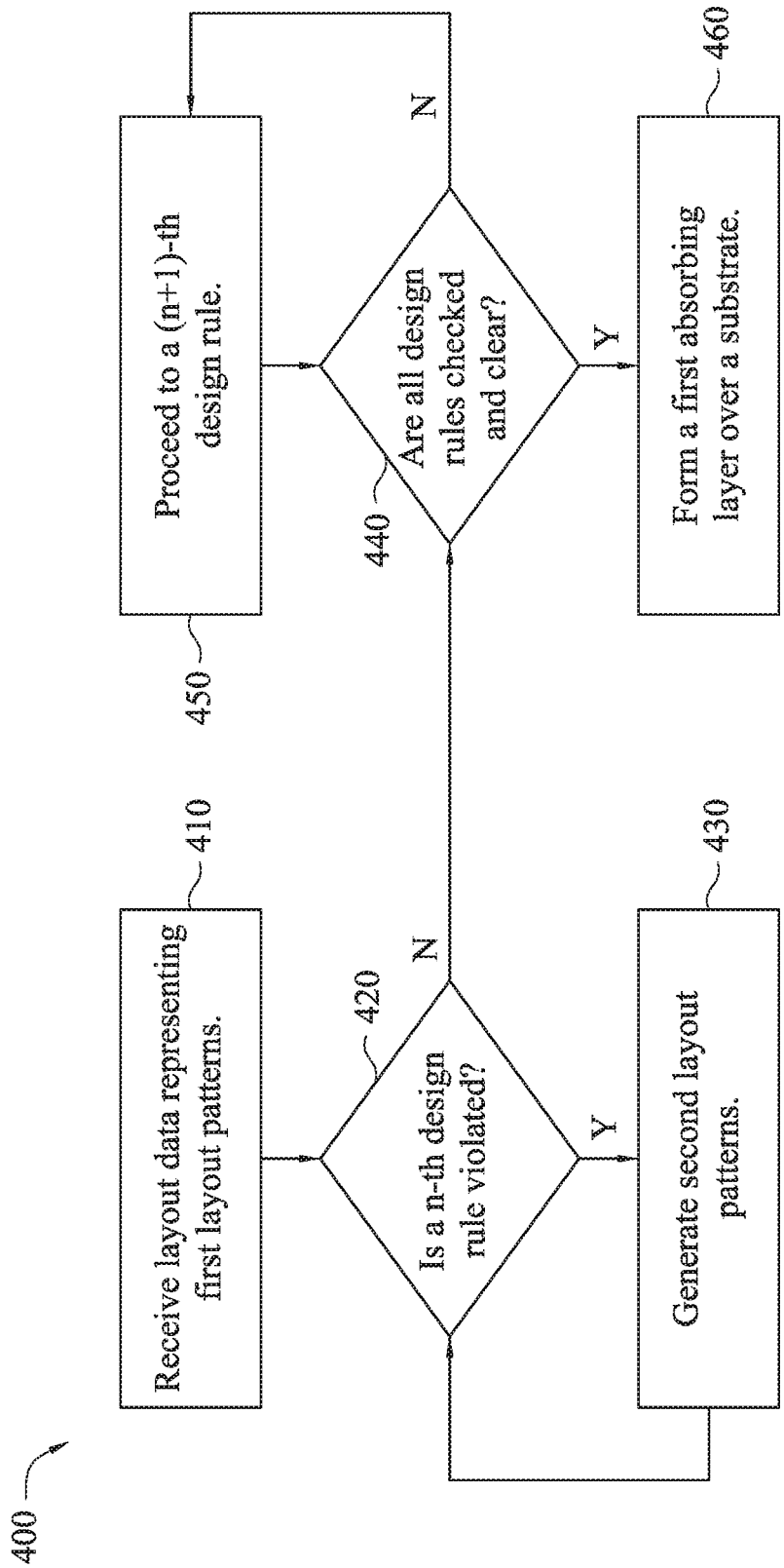
FIG. 4 is a flowchart of a method of fabricating a photomask in accordance with one or more embodiments.

FIG. 4 is a flowchart of a method of fabricating a photomask in accordance with one or more embodiments. In operation 410, layout data representing first layout patterns, e.g., a combination of first absorbing layer 220 and second absorbing layer 250 or a combination of first absorbing layer 320 and second absorbing layer 350, is received. The layout data represents polygons or openings to be formed over a semiconductor substrate. The layout data includes information about each pattern such as extensions, ends, and corner locations and sizes. In some embodiments, the layout data includes a number of layers having different patterns which are connected through various layers. The layout data are generated by an electronic design automation (EDA) tool such as Synphony from Synopsis®, Virtuoso from Cadence Systems®, and IC Station from Mentor Graphics®. The layout data is provided using a computer readable medium using a standard layout format, such as GDSII. In some embodiments, the layout data is provided through a software interface when the method is executed by an EDA system.

In operation 420, an n-th design rule is checked, wherein n is a positive integer indicating a specific design rule of a plurality of design rules to be checked. In some embodiments, a Design Rule Manual (DRM) is loaded and a Design Review Check (DRC) is executed. In some embodiments, a DRM is a file that includes one or multiple design rules including constraints followed by IC designers during the design of circuitry. In some embodiments, one or more design rules are a series of parameters used by photomask manufacturers that enable the designer to verify the correctness of a mask set. A DRC is used to describe pattern features and generate flags for violation sites including patterns and paths associated with selected feature received from a selected DRM. If the n-th design rule is violated, then one or more error flags are shown in the DRC output file and a user or a computer may provide options for adjustments. The first layout patterns are adjusted by isotropically shrinking each pattern of the first layout patterns in the first dimension and the second dimension. As indicated by the 'Y' arrow from operation 420, in operation 430 second layout patterns, e.g., first absorbing layer 220 or first absorbing layer 320, are generated. If the n-th design rule is not violated, then the next design rule is evaluated. As indicated by the 'N' arrow from operation 420, operation 440 determines whether all design rules are checked and passed. If at least one design rule is not checked or not passed yet, then method 400 is considered not completed. As indicated by the 'N' arrow from operation 440, method 400 proceeds to operation 450, where an (n+1)-th design rule is checked. If the (n+1)-th design rule is violated, then one or more error flags are shown in the DRC output file and the user or the computer provides options for adjustments. In some embodiments, the second layout patterns are adjusted and further shrunk in the first dimension and the second dimension. If all design rules are checked and passed, as indicated by the 'Y' arrow from operation 440, then method 400 continues with operation 460, a first absorbing layer, e.g., first absorbing layer 220 or first absorbing layer 320, is formed over a substrate, e.g., substrate 210 or substrate 310. In some embodiments, the first absorbing layer corresponds to the second layout patterns in operation 430. In some embodiments where multiple shrinkage operations are performed, the first absorbing layer corresponds to the last layout patterns after all design rules are checked and passed.

Figure 5:
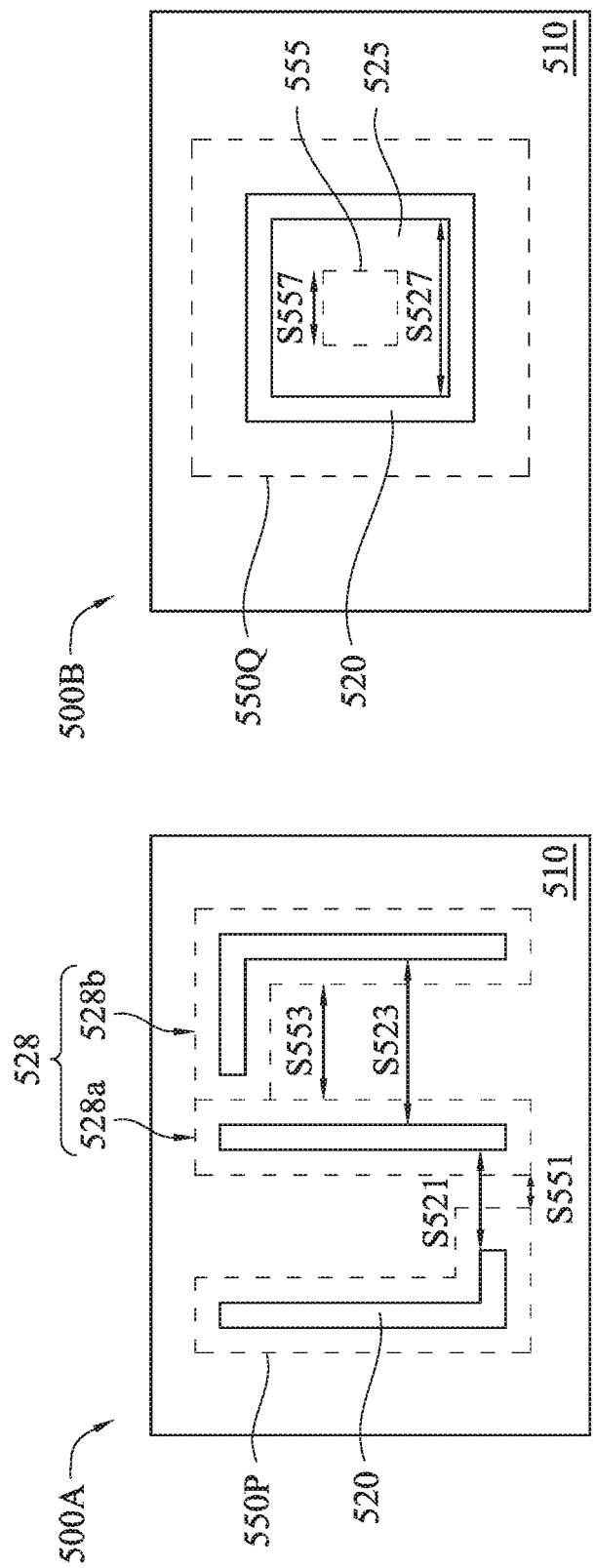
FIG. 5A is a top view of layout patterns on a photomask in accordance with one or more embodiments.
FIG. 5B is a top view of layout patterns on a photomask in accordance with one or more embodiments.

FIG. 5A is a top view of layout patterns on a photomask 500A in accordance with one or more embodiments. Photomask 500A includes elements similar to photomask 200 and a last two digits of like elements are the same. Photomask 500A includes a substrate 510 and a first absorbing layer 520. During a manufacturing of photomask 500A, when a predetermined pattern set 550P, e.g., first layout patterns in operation 410, violates a design rule, predetermined pattern set 550P is adjusted by reducing a width of each pattern or enlarging a spacing between patterns. For example, when a spacing S551 (e.g., a line-to-line rule) or a spacing S553 (e.g., a notch rule) is too small to be realized using the e-beam writing technique, each pattern of predetermined pattern set 550P is shrunk until a spacing S521 and a spacing S523 passes the design rule. In some embodiments, the shrinkage is calculated through logic operation, e.g., optical proximity correction (OPC) to meet the designed pitch or dimension upon selected patterns form predetermined pattern set 550P. Afterwards, a second absorbing layer corresponding to the predetermined pattern set 550P is formed using electroless plating or ALD. In some embodiments, the second absorbing layer is followed by merging multiple separate patterns in first absorbing layer 520, such as combining patterns 528a and 528b to form an inverted U-shaped pattern 528.

FIG. 5B is a top view of layout patterns on a photomask 500B in accordance with one or more embodiments. Similar to photomask 500A, when a spacing S557 (e.g., an enclosure rule) of an opening 555 is too small to be realized using the e-beam writing technique, each pattern of pattern set 550Q is shrunk until a spacing S527 of an opening 525 passes the design rule. Afterwards, the second absorbing layer is deposited and restored to pattern set 550Q by using electroless plating or ALD.

The advanced lithography process, method, and materials described above can be used in many applications, including fin-type field effect transistors (FinFETs). For example, the fins may be patterned to produce a relatively close spacing between features, for which the above disclosure is well suited. In addition, spacers used in forming fins of FinFETs, also referred to as mandrels, can be processed according to the above disclosure.

Figure 6:
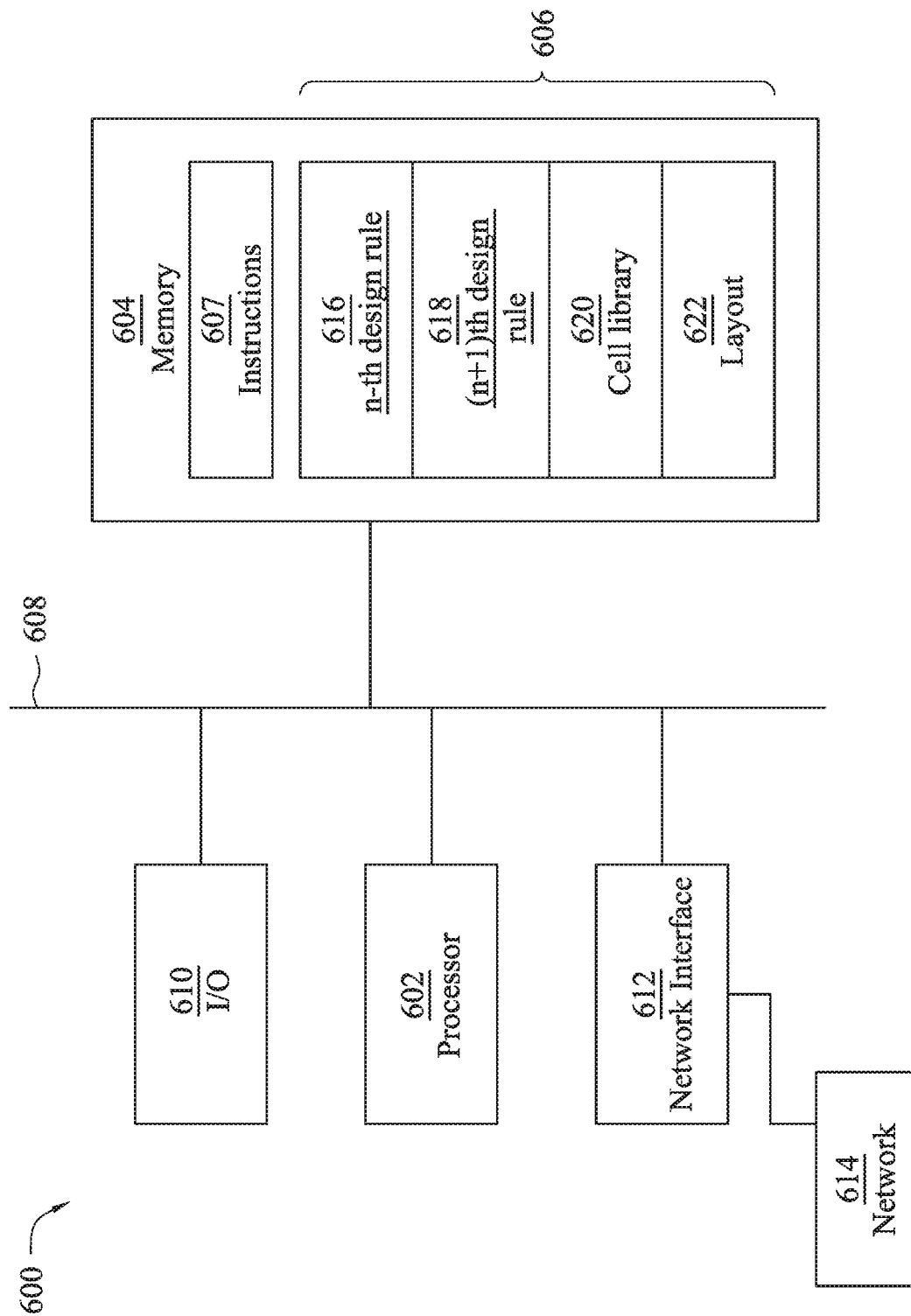
FIG. 6 is a schematic view of an integrated circuit (IC) designing system for manufacturing a photomask in accordance with one or more embodiments.

FIG. 6 is a schematic view of an IC designing system 600 for designing a photomask in accordance with one or more embodiments. System 600 includes hardware processor circuitry 602, also referred to as a processor, and a non-transitory, computer readable storage medium 604 encoded with, i.e., storing, the computer program code 607, i.e., a set of executable instructions. Computer readable storage medium 604 is also encoded with instructions 607 for interfacing with manufacturing machines for producing a semiconductor device based on the layout. The processor 602 is electrically coupled to the computer readable storage medium 604 via a bus 608. The processor 602 is also electrically coupled to an I/O interface 610 by bus 608. A network interface 612 is also electrically connected to the processor 602 via bus 608. Network interface 612 is connected to a network 614, so that processor 602 and computer readable storage medium 604 are capable of connecting to external elements via network 614. Processor 602 is configured to execute the computer program code 606 encoded in the computer readable storage medium 604 in order to cause system 600 to be usable for performing a portion or all of the operations as described in method 400.

In some embodiments, the processor 602 is a central processing unit (CPU), a multi-processor, a distributed processing system, an application specific integrated circuit (ASIC), and/or a suitable processing unit.

In some embodiments, the computer readable storage medium 604 is a non-transitory electronic, magnetic, optical, electromagnetic, infrared, and/or a semiconductor system (or apparatus or device). For example, the computer readable storage medium 604 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 504 includes a compact disk-read only memory (CD-ROM), a compact disk-read/write (CD-R/W), and/or a digital video disc (DVD).

In some embodiments, the storage medium 604 stores the computer program code 606 configured to cause system 600 to perform method 400. In some embodiments, the storage medium 604 also stores information needed for performing a method 400 as well as information generated during performing the method 400, such as a n-th design rule parameter 616, a (n+1)th design rule parameter 618, a cell library parameter 620, a layout parameter 622, and/or a set of executable instructions to perform the operation of method 400.

In some embodiments, the storage medium 604 stores instructions 607 for interfacing with manufacturing machines. The instructions 607 enable processor 602 to generate manufacturing instructions readable by the manufacturing machines to effectively implement method 400 during a circuit design process of a manufacturing process.

System 600 includes I/O interface 610. I/O interface 610 is coupled to external circuitry. In some embodiments, I/O interface 610 includes a keyboard, keypad, mouse, trackball, trackpad, and/or cursor direction keys for communicating information and commands to processor 602.

System 600 also includes network interface 612 coupled to the processor 602. Network interface 612 allows system 600 to communicate with network 614, to which one or more other computer systems are connected. Network interface 612 includes wireless network interfaces such as BLUETOOTH, WIFI, WIMAX, GPRS, or WCDMA; or wired network interface such as ETHERNET, USB, or IEEE-1394. In some embodiments, method 400 is implemented in two or more systems 600, and information such as physical spacing rules, color spacing rules, cell libraries or a layout are exchanged between different systems 600 via network 614.

System 600 is configured to receive information related to a physical spacing rule through I/O interface 610 or network interface 612. The information is transferred to processor 602 via bus 608 to determine a physical spacing rule for the layout design process. The physical spacing rule is then stored in computer readable medium 604 as physical spacing rule parameter 616. System 600 is configured to receive information related to color spacing rules through I/O interface 610 or network interface 612. The information is stored in computer readable medium 604 as color spacing rule parameter 618. System 600 is configured to receive information related to a cell library through I/O interface 610 or network interface 612. The information is stored in computer readable medium 604 as cell library parameter 620. System 600 is configured to receive information related to a layout through I/O interface 610 or network interface 612. The information is stored in computer readable medium 604 as layout parameter 622.

During operation, processor 602 executes a set of instructions to assign color groups to routing tracks and colors to conductive elements based on the stored parameters 616-622. In some embodiments, system 600 is configured to generate instructions for controlling manufacturing machines for forming masks based on layout parameter 622 as modified during method 400.

Figure 7:
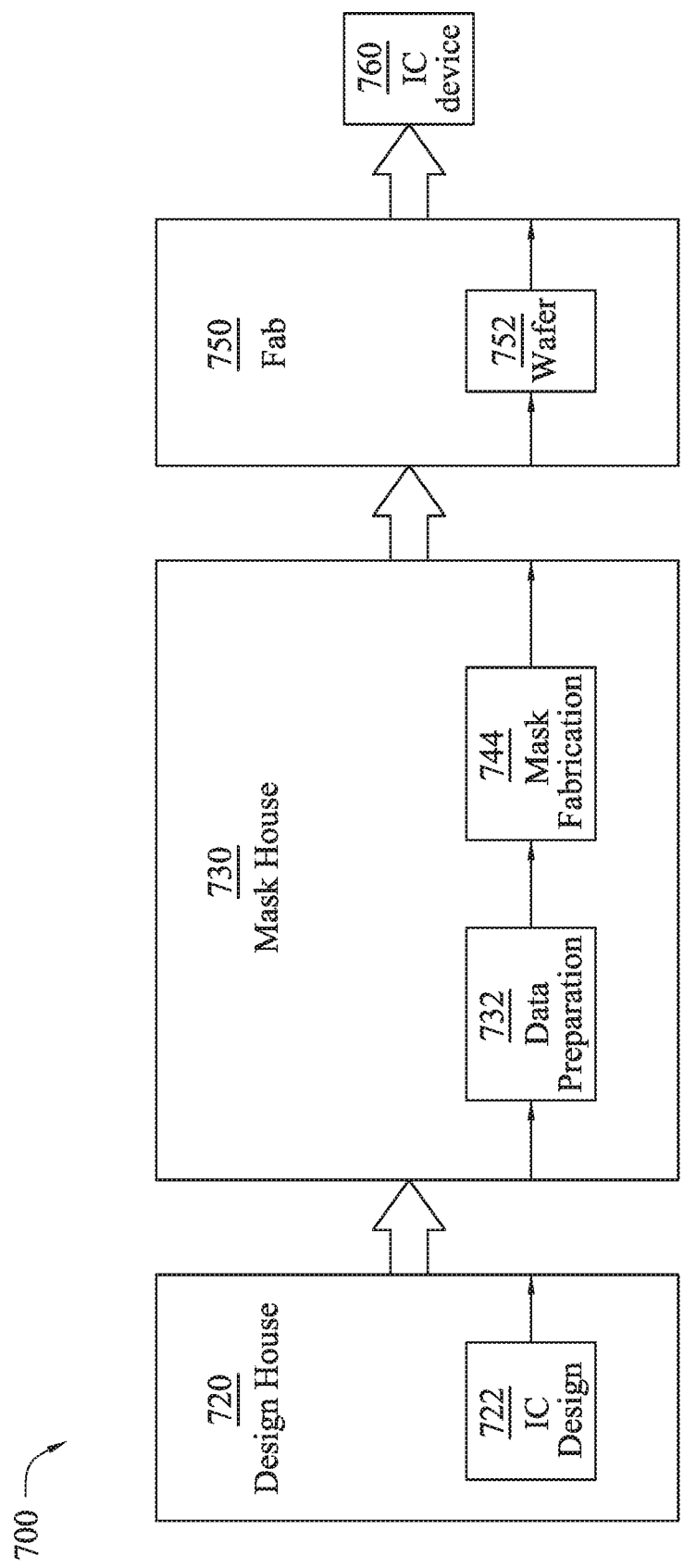
FIG. 7 is a block diagram of an IC manufacturing system, and an IC manufacturing flow associated therewith, in accordance with some embodiments.

FIG. 7 is a block diagram of an IC manufacturing system 700, and an IC manufacturing flow associated therewith, in accordance with some embodiments. IC manufacturing system 700 generates a layout (e.g., any one of layouts 500A or 500B of corresponding FIGS. 5A and 5B, or the like). Based on the layout, system 700 fabricates at least one of (a) one or more photomasks or (b) at least one component in a layer of an inchoate semiconductor IC.

IC manufacturing system 700 includes entities, such as a design house 720, a mask house 730, and an IC manufacturer/fabricator ("fab") 750, that interact with one another in the design, development, and manufacturing cycles and/or services related to manufacturing an IC device 760. The entities in system 700 are connected by a communications network. In some embodiments, the communications network is a single network. In some embodiments, the communications network is a variety of different networks, such as an intranet and the internet. The communications network includes wired and/or wireless communication channels. Each entity interacts with one or more of the other entities and provides services to and/or receives services from one or more of the other entities. In some embodiments, two or more of design house 720, mask house 730, and IC fab 750 is owned by a single larger company. In some embodiments, two or more of design house 720, mask house 730, and IC fab 750 coexist in a common facility and use common resources.

Design house (or design team) 720 generates an IC design layout 722. IC design layout 722 includes various geometrical patterns designed for an IC device 760. The geometrical patterns correspond to patterns of conductive, dielectric, or semiconductor layers that make up the various components of IC device 760 to be fabricated. The various layers combine to form various IC features. For example, a portion of IC design layout 722 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 720 implements a proper design procedure to form IC design layout 722. The design procedure includes one or more of logic design, physical design or place and route. IC design layout 722 is presented in one or more data files having information of the geometrical patterns. For example, IC design layout 722 is expressed in a GDSII file format or DFII file format.

Mask house 730 includes data preparation 732 and mask fabrication 744. Mask house 730 uses IC design layout 722 to manufacture one or more masks to be used for fabricating the various layers of IC device 760 according to IC design layout 722. Mask house 730 performs mask data preparation 732, where IC design layout 722 is translated into a representative data file ("RDF"). Mask data preparation 732 provides the RDF to mask fabrication 744. Mask fabrication 744 includes a mask writer. The mask writer converts the RDF to an image on a substrate, such as a photomask (reticle) or a semiconductor wafer. IC design layout 722 is manipulated by mask data preparation 732 to comply with particular characteristics of the mask writer and/or requirements of IC fab 750. In FIG. 7, mask data preparation 732 and mask fabrication 744 are illustrated as separate elements. In some embodiments, mask data preparation 732 and mask fabrication 744 is collectively referred to as mask data preparation.

In some embodiments, mask data preparation 732 includes optical proximity correction (OPC) which uses lithography enhancement techniques to compensate for image errors, such as those that can arise from diffraction, interference, other process effects or the like. OPC adjusts IC design layout 722. In some embodiments, mask data preparation 732 includes further resolution enhancement techniques (RET), such as off-axis illumination, sub-resolution assist features, phase-shifting masks, other suitable techniques, or the like or combinations thereof. In some embodiments, inverse lithography technology (ILT) is also used, which treats OPC as an inverse imaging problem.

In some embodiments, mask data preparation 732 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, or the like. In some embodiments, the MRC modifies the IC design layout to compensate for limitations during mask fabrication 744, which may undo part of the modifications performed by OPC in order to meet mask creation rules.

In some embodiments, mask data preparation 732 includes lithography process checking (LPC) that simulates processing that will be implemented by IC fab 750 to fabricate IC device 760. LPC simulates this processing based on IC design layout 722 to create a simulated manufactured device, such as IC device 760. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, or the like or combinations thereof. In some embodiments, after a simulated manufactured device has been created by LPC, if the simulated device is not close enough in shape to satisfy design rules, OPC and/or MRC are be repeated to further refine IC design layout 722.

It should be understood that the above description of mask data preparation 732 has been simplified for the purposes of clarity. In some embodiments, data preparation 732 includes additional features such as a logic operation (LOP) to modify the IC design layout according to manufacturing rules. Additionally, the processes applied to IC design layout 722 during data preparation 732 may be executed in a variety of different orders.

After mask data preparation 732 and during mask fabrication 744, a mask or a group of masks are fabricated based on the modified IC design layout. In some embodiments, an e-beam or a mechanism of multiple e-beams is used to form a pattern on a photomask (reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. The mask(s) generated by mask fabrication 744 is used in a variety of processes. For example, such a mask(s) is used in an ion implantation process to form various doped regions in the semiconductor wafer, in an etching process to form various etching regions in the semiconductor wafer, and/or in other suitable processes.

IC fab 750 is an IC fabrication business that includes one or more manufacturing facilities for the fabrication of a variety of different IC products. In some embodiments, IC Fab 750 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 750 uses the mask (or masks) fabricated by mask house 730 to fabricate IC device 760. Thus, IC fab 750 at least indirectly uses IC design layout 722 to fabricate IC device 760. In some embodiments, a semiconductor wafer 752 is fabricated by IC fab 750 using the mask (or masks) to form IC device 760. Semiconductor wafer 752 includes a silicon substrate or other proper substrate having material layers formed thereon. Semiconductor wafer further includes one or more of various doped regions, dielectric features, multilevel interconnects, or the like (formed at subsequent manufacturing steps).

Details regarding an IC manufacturing system (e.g., system 700 of FIG. 7), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of manufacturing a photomask. The method includes depositing a first absorbing layer over a substrate, patterning the first absorbing layer using a photoresist, and depositing a conformal second absorbing layer along surfaces of the first absorbing layer.

Another aspect of this description relates to a method of manufacturing a photomask. The method includes receiving layout data representing first layout patterns, determining whether a distance between adjacent patterns of the first layout patterns violates a design rule, and generating second layout patterns, using hardware processing circuitry, by reducing the first layout patterns in a first dimension and a second dimension perpendicular to the first dimension when the first design rule is violated. A distance between adjacent patterns of the second layout patterns satisfies the design rule. The method further includes forming a first absorbing layer over a transparent substrate. The first absorbing layer corresponds to the second layout patterns. The method further includes depositing a second absorbing layer lining the first absorbing layer. A combination of the first absorbing layer and the second absorbing layer corresponds to the first layout patterns.

Still another aspect of this description relates to a photomask. The photomask includes a substrate, a first absorbing layer over the substrate, and a second absorbing layer extending along surfaces of the first absorbing layer. The width of the second absorbing layer is from about two times to about ten times greater than a width of the first absorbing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a photomask, the method comprising:
   depositing a first absorbing layer over a substrate;
   patterning the first absorbing layer using a photoresist, wherein the patterned first absorbing layer has a thickness ranging from about 100 Å to about 500 Å;
   depositing a conformal second absorbing layer along top and side surfaces of the first absorbing layer, wherein a thickness of the conformal second absorbing layer ranges from about 500 Å to about 1,000 Å measured from each of the top and side surfaces of the first absorbing layer; and
   depositing a phase shifter over the conformal second absorbing layer and the substrate, wherein
   a portion of the substrate is exposed by the first absorbing layer, the conformal second absorbing layer and the phase shifter.

2. The method of claim 1, wherein the depositing of the first absorbing layer comprises:
   depositing the first absorbing layer using electroless plating or atomic layer deposition (ALD).

3. The method of claim 1, wherein the depositing of the conformal second absorbing layer comprises:
depositing the conformal second absorbing layer using electroless plating or atomic layer deposition (ALD).

4. The method of claim 1, wherein the depositing of the conformal second absorbing layer comprises:
depositing the conformal second absorbing layer using a same process as that for depositing the first absorbing layer.

5. The method of claim 1, wherein the depositing of the conformal second absorbing layer comprises:
depositing the conformal second absorbing layer using a different process from that for depositing the first absorbing layer.

6. The method of claim 1, wherein the depositing of the conformal second absorbing layer comprises:
depositing the conformal second absorbing layer to have a thickness about two times to about ten times greater than a thickness of the first absorbing layer.

7. The method of claim 1, wherein the patterning of the first absorbing layer comprises:
coating a photoresist over the first absorbing layer;
exposing and developing the photoresist to define a pattern set; and
removing an exposed portion of the first absorbing layer to form a pattern set.

8. The method of claim 1, further comprising:
depositing a third absorbing layer along surfaces of the conformal second absorbing layer.

9. The method of claim 1, further comprising:
receiving layout data representing first layout patterns;
determining whether a distance between adjacent patterns of the first layout patterns violates a design rule;
generating second layout patterns, using hardware processing circuitry, by reducing the first layout patterns in a first dimension and a second dimension perpendicular to the first dimension when the design rule is violated, wherein a distance between adjacent patterns of the second layout patterns satisfies the design rule;
wherein patterning the first absorbing layer comprises patterning the first absorbing layer corresponds to the second layout patterns; and
depositing the second absorbing layer comprises depositing the second absorbing layer such that a combination of the first absorbing layer and the second absorbing layer corresponding to the first layout patterns.

10. The method of claim 9, further comprising:
merging at least two adjacent patterns of the second layout patterns which are separated from each other to become one continuous pattern in the first layout patterns.

11. The method of claim 1, wherein the phase shifter has a first portion, and the depositing of the phase shifter comprises depositing the first portion of the phase shifter directly on the substrate.

12. The method of claim 11, wherein the phase shifter comprises a second portion different from the first portion, and the depositing of the phase shifter comprises depositing the second portion of the phase shifter directly on the conformal second absorbing layer.

13. The method of claim 1, wherein the depositing of the phase shifter comprises depositing a plurality of layers to form the phase shifter.

14. A photomask comprising:
a substrate;
a first absorbing layer over the substrate;
a second absorbing layer extending along surfaces of the first absorbing layer, wherein a width of the second absorbing layer is from about two times to about ten times greater than a width of the first absorbing layer; the second absorbing layer is conformal on the first absorbing layer, and the substrate is exposed between adjacent portions of the second absorbing layer; and
a phase shifter over the second absorbing layer, wherein the phase shifter is configured to cause a $\pi$ shift of incident radiation.

15. The photomask of claim 14, wherein
the first absorbing layer includes a same material as the second absorbing layer.

16. The photomask of claim 14, wherein
the first absorbing layer includes a different material from the second absorbing layer.

17. The photomask of claim 14, wherein
a line width roughness (LWR) of a top surface of the second absorbing layer is equal to or smaller than 2 nanometers (nm).

18. The photomask of claim 14, wherein
an angle between a top surface of the second absorbing layer and a sidewall of the second absorbing layer ranges from about 90 degrees to about 93 degrees.

* * * * *